US009613169B2

(12) United States Patent
Grant et al.

(10) Patent No.: US 9,613,169 B2
(45) Date of Patent: Apr. 4, 2017

(54) VESSEL STABILITY SIMULATOR

(71) Applicant: Canadian Council of Professional Fish Harvesters, Ottawa (CA)

(72) Inventors: Bob Grant, Parksville (CA); Mark Dolomount, Paradise (CA); William Broderick, St. Brendans (CA); Ronald Heighton, River John (CA); Daniel Landry, Caraquet (CA); Keith Paugh, O'Leary (CA); John Sutcliffe, Cantley (CA); Rick Wiliams, Halifax (CA); Serge Langelier, Sept-Iles (CA); Ron Cormier, Grand-Barachois (CA); Roy Gibbons, St. John's (CA); Anthony Patterson, St. John's (CA)

(73) Assignee: Canadian Council of Professional Fish Harvesters, Ottawa (CA)

( * ) Notice: Subject to any disclaimer, the term of this patent is extended or adjusted under 35 U.S.C. 154(b) by 721 days.

(21) Appl. No.: 14/093,945

(22) Filed: Dec. 2, 2013

(65) Prior Publication Data
US 2015/0154325 A1 Jun. 4, 2015

(51) Int. Cl.
G06F 17/50 (2006.01)

(52) U.S. Cl.
CPC ...... *G06F 17/5009* (2013.01); *G06F 17/5095* (2013.01)

(58) Field of Classification Search
USPC ............... 703/2, 5; 245/550; 701/1; 706/46; 414/137.1
See application file for complete search history.

(56) References Cited

U.S. PATENT DOCUMENTS

| 5,154,561 | A | * | 10/1992 | Lee | ........................ | B63B 27/12 |
|---|---|---|---|---|---|---|
| | | | | | | 114/264 |
| 5,988,097 | A | * | 11/1999 | Karney | .................... | B63B 1/22 |
| | | | | | | 114/283 |
| 6,275,769 | B1 | | 8/2001 | Willis | | |
| 6,923,375 | B2 | | 8/2005 | Stefani | | |
| 7,734,449 | B1 | * | 6/2010 | Lin | ..................... | G06F 17/5018 |
| | | | | | | 703/2 |
| 8,260,736 | B1 | * | 9/2012 | Lear | ........................ | G06N 5/02 |
| | | | | | | 706/46 |
| 8,301,318 | B2 | * | 10/2012 | Lacaze | ................ | G05D 1/0044 |
| | | | | | | 701/1 |

(Continued)

*Primary Examiner* — Thai Phan
(74) *Attorney, Agent, or Firm* — Benoît & Côté Inc.

(57) ABSTRACT

The present document describes a computing platform for simulating stability-related variables of a vessel comprising vessel elements placed in a given configuration, the computing platform comprising: a database for storing: a list of the vessel elements and information about the vessel elements; a simulation module for computing values of the stability-related variables using the vessel elements placed in the given configuration and the information about the vessel elements; and a graphical user interface for: receiving user instructions about a selection of the vessel elements among the list of the vessel elements and about the configuration of the vessel elements on the vessel; outputting the values of the stability-related variables; and displaying a representation of the vessel indicative of the values of the stability-related variables.

21 Claims, 7 Drawing Sheets

(56) References Cited

U.S. PATENT DOCUMENTS

| | | | |
|---|---|---|---|
| 8,672,288 B2* | 3/2014 | van der Tempel | B63B 17/00 248/550 |
| 2009/0192846 A1 | 7/2009 | Stefani | |
| 2009/0276105 A1* | 11/2009 | Lacaze | G05D 1/0044 701/2 |
| 2012/0221235 A1 | 8/2012 | Prudhomme-Lacroix et al. | |

* cited by examiner

VESSEL STABILITY SIMULATOR

BACKGROUND (a) Field

The subject matter disclosed generally relates to simulators for vessels. More specifically, the subject matter relates to tools for simulating the stability of a vessel.

(b) Related Prior Art

In the marine industry, in which vessels of all types operate in various locations under highly variable environmental conditions, safety is a critical issue. The design of a vessel, the way it is loaded, the way it is operated, and the environmental conditions within which it operates all affect the stability of the vessel. The risk of capsizing must therefore be minimized to increase the safety of the crew on board.

One of the ways to increase safety is to train the crew to recognize the effects of loading, wind, waves and other practical considerations on the stability of the boat. By augmenting education programs through specialized tools, better practices can be put in place in the marine industry to improve safety at sea.

Simulation tools for transportation already exist. For example, flight simulators are well known to the public as well as simulators for vessel manoeuvring and various marine operations. However, there is no simulation tool specifically designed for the training of vessel crew on how loading conditions affect their vessel's stability. For example, in the case of fishing vessels, loading a fish net under windy conditions may lead to capsizing, depending on how the equipment is spatially configured on the vessel. People working in such contexts need a tool for studying, the combined effect of both equipment configuration and environmental conditions with respect to how much their vessel is close to capsizing. Such a tool allows them to learn in a safe and risk-free environment.

There is thus a need for a simulator for simulating stability-related variables of a vessel in operational situations.

SUMMARY

According to an embodiment, there is provided a computing platform for simulating stability-related variables of a vessel comprising vessel elements placed in a given configuration, the computing platform comprising: a database for storing: a list of the vessel elements and information about the vessel elements; a simulation module for computing values of the stability-related variables using the vessel elements placed in the given configuration and the information about the vessel elements; and a graphical user interface for: receiving user instructions about a selection of the vessel elements among the list of the vessel elements and about the configuration of the vessel elements on the vessel; outputting the values of the stability-related variables; and displaying a representation of the vessel indicative of the values of the stability-related variables.

According to another embodiment, the simulation module for computing the values of the stability-related variables is further for computing the value of at least one of a metacentric height and a GZ curve using the vessel elements placed in the given configuration and the information about the vessel elements.

According to another embodiment, the simulation module is further for determining if the value of at least one of the metacentric height and an area under the GZ curve meets given stability criteria.

According to another embodiment, the database for storing the list of the vessel elements comprises a database for storing a list of vessel elements comprising: a hull, an engine, a tank, and a piece of equipment for loading.

According to another embodiment, the database for storing information about the vessel elements comprises a database for storing at least one of a weight, a density and size data about the vessel elements.

According to another embodiment, the database further comprises rules about the configuration of the vessel elements on the vessel, and wherein the simulation module is further for determining if the user instructions about the configuration of the vessel elements on the vessel respect the rules.

According to another embodiment, the simulation module is further for transiting from a current phase to at least one of a next phase and a previous phase, at least one of the current phase, the next phase and the previous phase being characterized by allowed actions, the allowed actions comprising at least one of selecting the vessel elements among the list of the vessel elements, spatially configuring the vessel elements on the vessel, performing loading tasks with the vessel and displaying the values of the stability-related variables.

In another aspect of the invention, there is provided a method for simulating stability-related variables of a vessel comprising vessel elements placed in a given configuration, the method comprising: receiving, through a graphical user interface, user instructions about a selection of the vessel elements among a list of vessel elements and about the configuration of the vessel elements on the vessel; receiving information about the vessel elements; computing values of the stability-related variables using the vessel elements placed in the given configuration and the information about the vessel elements; outputting the values of the stability-related variables on the graphical user interface; displaying a representation of the vessel indicative of the values of the stability-related variables on the graphical user interface.

According to another embodiment, computing the values of the stability-related variables comprises computing the value of at least one of a metacentric height and a GZ curve using the vessel elements placed in the given configuration and the information about the vessel elements.

According to another embodiment, there is further provided determining if the value of at least one of the metacentric height and an area under the GZ curve meets given stability criteria.

According to another embodiment, receiving user instructions about a selection of the vessel elements among a list of vessel elements comprises receiving a selection of the vessel elements among a list comprising: a hull, an engine, a tank, and a piece of equipment for loading.

According to another embodiment, receiving information about the vessel elements comprises receiving at least one of a weight, a density and size data about the vessel elements.

According to another embodiment, receiving user instructions about the configuration of the vessel elements on the vessel comprises determining if the configuration respects configuration rules.

According to another embodiment, there is further provided transiting from a current phase to at least one of a next phase and a previous phase, at least one of the current phase, the next phase and the previous phase being characterized by allowed actions, the allowed actions comprising at least one of selecting the vessel elements among the list of the vessel elements, spatially configuring the vessel elements on the vessel, performing loading tasks with the vessel and displaying the values of the stability-related variables.

In another aspect of the invention, there is provided a computing device for simulating stability-related variables of a vessel comprising vessel elements placed in a given configuration, the computing device comprising: a processing device; a memory for storing a list of the vessel elements and information about the vessel elements; a memory for storing instructions which cause the processing device: to get user instructions about a selection of the vessel elements among the list of the vessel elements and about the configuration of the vessel elements on the vessel; to compute values of the stability-related variables using the vessel elements placed in the given configuration and the information about the vessel elements; and to output the values of the stability-related variables; and a visual display for displaying a representation of the vessel indicative of the values of the stability-related variables, wherein the processing device, the memories and the visual display are in communication together.

According to another embodiment, the instructions comprise instructions which cause the processing device to compute the value of at least one of a metacentric height and a GZ curve using the vessel elements placed in the given configuration and the information about the vessel elements.

According to another embodiment, the instructions further comprising instructions which cause the processing device to determine if the value of at least one of the metacentric height and an area under the GZ curve meets given stability criteria.

According to another embodiment, the memory for storing a list of the vessel elements comprises a memory for storing a list comprising: a hull, an engine, a tank, and a piece of equipment for loading.

According to another embodiment, the memory for storing information about the vessel elements comprises a memory for storing at least one of a weight, a density and size data about the vessel elements.

According to another embodiment, the instructions comprise instructions which cause the processing device to determine if the configuration respects configuration rules.

According to another embodiment, the instructions further comprise instructions which cause the processing device to transit from a current phase to at least one of a next phase and a previous phase, at least one of the current phase, the next phase and the previous phase being characterized by allowed actions, the allowed actions comprising at least one of selecting the vessel elements among the list of the vessel elements, spatially configuring the vessel elements on the vessel, performing loading tasks with the vessel and displaying the values of the stability-related variables.

The following terms are defined below.

The term "vessel" is intended to mean any type of boat, ship or any means of transport that floats on water.

The phrase "stability-related variables" is intended to mean any variable, mostly those that are used in hydrostatic formulas, which can give information about how a vessel is stable on the water, how it respects stability standards, or how close it is to capsizing.

The term "computing platform" is intended to mean any type of application, software product or machine-implemented functional interface.

Features and advantages of the subject matter hereof will become more apparent in light of the following detailed description of selected embodiments, as illustrated in the accompanying figures. As will be realized, the subject matter disclosed and claimed is capable of modifications in various respects, all without departing from the scope of the claims. Accordingly, the drawings and the description are to be regarded as illustrative in nature and not as restrictive and the full scope of the subject matter is set forth in the claims.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

In embodiments there are disclosed a modular computing platform and a method therefor for simulating a vessel stability by computing the values of stability-related variables according to a specific configuration of the vessel.

Modular Computing platform for Simulating Vessel Stability

Figure 1:
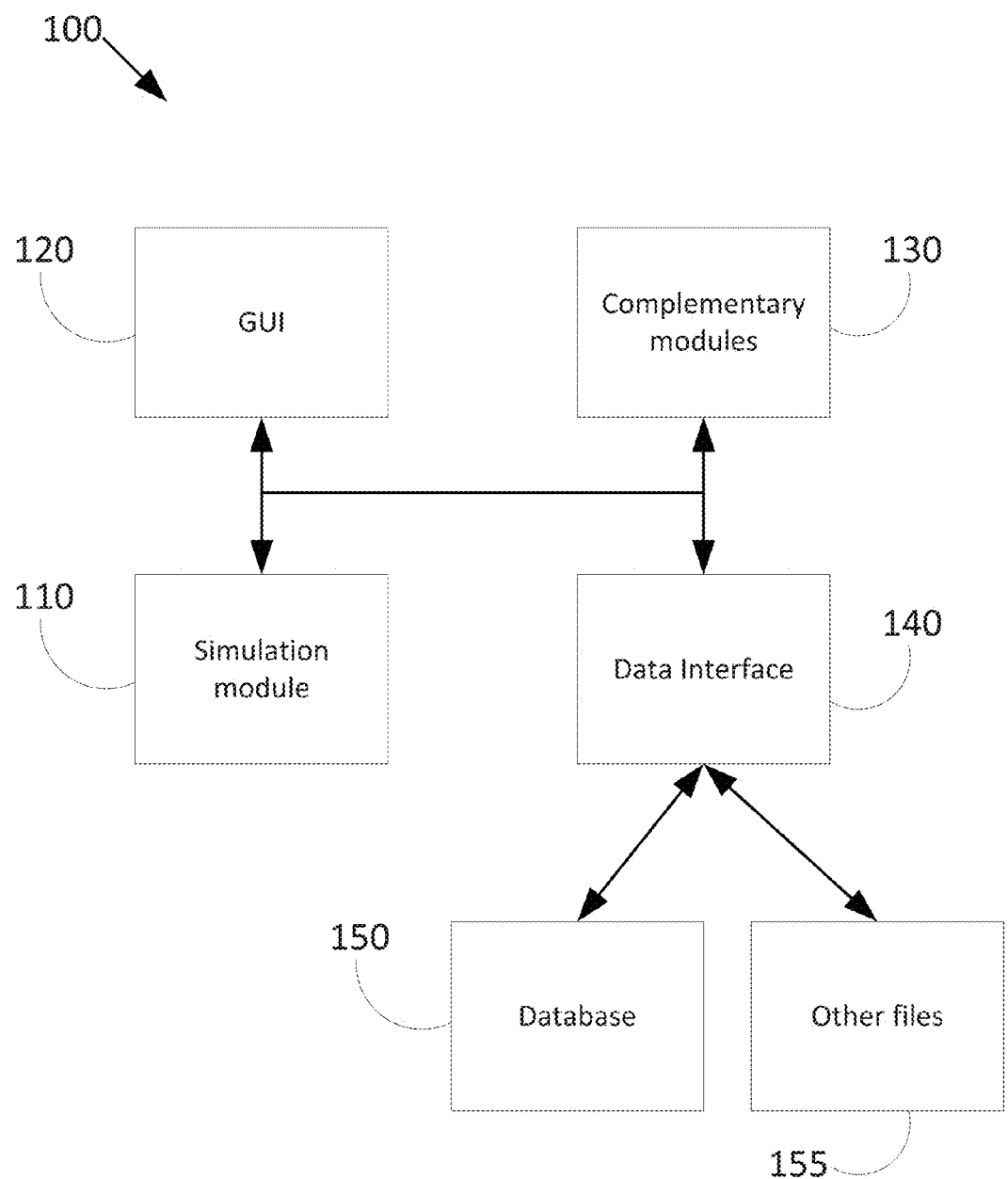
FIG. 1 is a block diagram illustrating the modular computing platform for simulating stability-related variables, according to an embodiment.

Referring now to the drawings, and more particularly to FIG. 1, a block diagram illustrates a vessel stability simulator 100 embodied as a computing platform comprising a plurality of modules, each of the modules being configured to accomplish a specific function.

The vessel stability simulator 100, according to an embodiment, comprises a graphical user interface 120, also known as a GUI 120. The GUI 120 is responsible for receiving input from a user. The GUI 120 may therefore allow input in various ways, such as single-selection or multiple-selections choices, boxes with text input function (for words and numbers). When a choice is prompted to users, they may therefore make their own choice through the selection/input functions of the GUI 120.

The vessel stability simulator 100 further comprises a simulation module 110, also known as a simulator 110. The simulation module 110 is configured for two functions: performing the simulation flow (i.e., having the steps happening one after the other so that the simulation continues to be performed once it has begun), and performing calculations related to the stability of the vessel (for example hydrostatic variables of the vessel) at various times while the simulation progresses.

Complementary modules 130 may also be needed according to the embodiment. For example, complementary modules 130 may comprise modules or sub-modules for rendering effects (for waves, sky, shadows, light effects, etc.), 3D effects, sound effects, translation of the text displayed on the GUI 120, etc. Complementary modules 130 may thus be provided if a more realistic GUI 120 is wanted. In the same fashion, complementary modules 130 may be needed to provide the simulation module 110 with functions that are not necessary for simulating hydrostatic or stability-related variables of the vessel but that can give a more realistic simulation.

The GUI 120 and the simulation module 110 are in communication with each other to allow a flow of data and/or instructions to be established.

There is further provided a data interface 140 which allows other modules to extract data they need to work properly. The data interface 140 is in communication with other modules (110, 120) and gives them access to data. The data may be a part of a database 150 or other files 155. The other files 155 refer to all types of data and files that do not contain information for performing the simulation. The other files 155 may therefore be used by the complementary modules 130 (for example, they contain information useful for rendering/3D/sound effects or translation).

The database 150 comprises many types of data that are useful for simulating hydrostatic variables of a vessel, a task which is performed by the simulation module 110. The data may comprise various vessel elements and information about them, such as mass (or weight), shape or dimensions, volume, density and other mechanical properties. The information about the vessel elements may also include the type of elements, when an element exists in various types. The vessel elements may comprise lightship elements: hull, wheelhouse, decking, engine, fuel tank, water tank, fish hold, etc. The hull may be hard chine (planning or full displacement) or round bilge (semi-displacement or full displacement). Information about wheelhouse, decking, etc., is diverse since these elements are chosen according to hull type and size. Other vessels elements that can be added are: anchor, mast, wheelhouse mast, A-frame, additional engines, life rafts, etc. If the vessel is a passenger boat, stairs, ramps, passenger facilities and the like may be added. If the vessel is a fishing boat, the vessel elements may be fishing gear, such as fish pumps, nets/traps/longlines, net/trap/longline haulers, crab/lobster pots, baits, power packs, seines, drum seines, winches, longline tubs and the like. Other data may be provided in the database 150 relating to people (weight and repartition) or to consumables (fuel, water, fish/lobster/crabs, etc.). Therefore, the database 150 contains various elements that may probably be found on a vessel and knows the weight/density of these elements.

The database 150 may also contain rules. For example, not every vessel element may be used in combination with some of the others. For example, large engines, tall masts or powerful power packs may not be used on a small vessel. Some hull sizes are not available for specific hull types. The database 150 thus knows the forbidden combinations. This information may also be provided in another file or in the other files 155, or in another module such as the simulation module 110. Similarly, according to an embodiment, the database 150 may be split in a plurality of smaller databases for a logical separation of vessel elements into more than one file.

The simulation module 110, the GUI 120, the complementary modules 130 (if it exists in the embodiment) and the data interface 140 are thus in communication with each other using, for example, a data bus to allow data and instructions to flow between them. According to an embodiment, the data interface 140 may be non-existent, thus allowing a direct use of the database 150 and the other files 155 by the modules (110, 120, 130).

Figure 2:
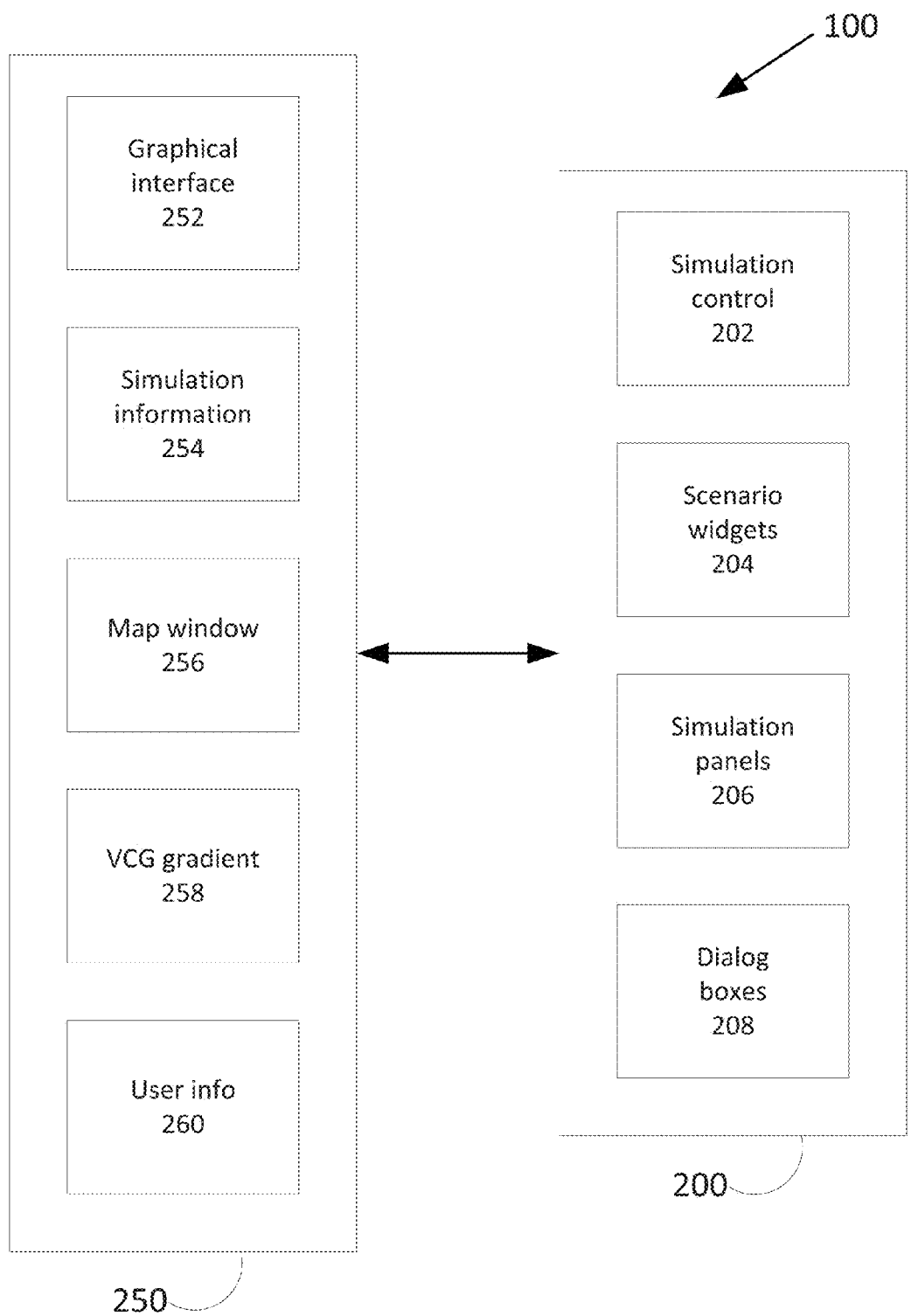
FIG. 2 is a block diagram illustrating the graphical user interface, according to an embodiment.

Now referring to FIG. 2, there is shown an embodiment of the GUI 120. The GUI 120 serves as an intermediary between the modular computing platform and its user and should be implemented to work on a display device (such as a screen, projector, etc.).

The GUI 120 should have input means 200 for receiving input from the user, and output means for outputting results to the user.

Figure 4:
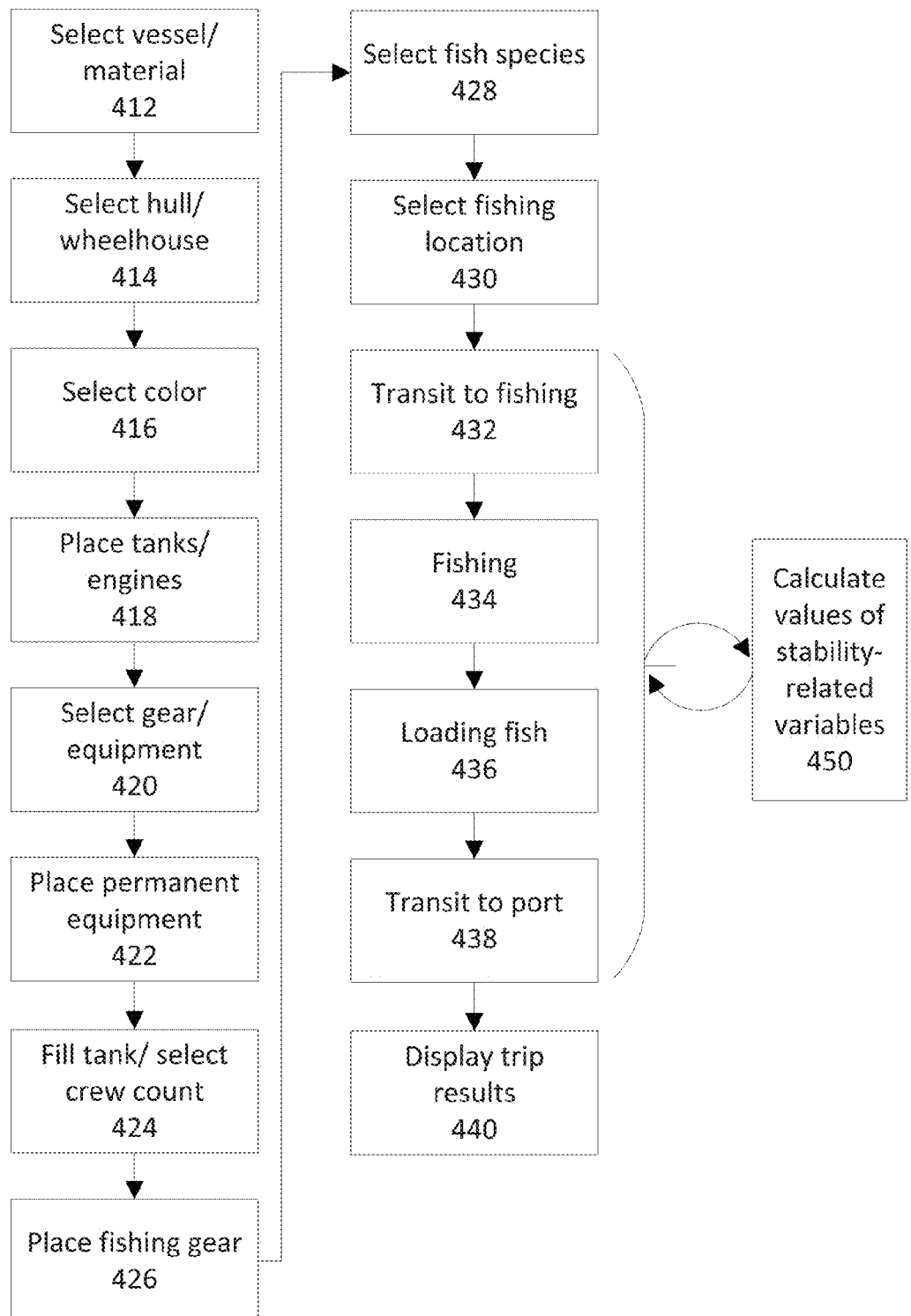
FIG. 4 is a flowchart illustrating the steps performed for simulating stability-related variables of a fishing vessel during a fishing trip, according to an embodiment.
Figure 5:
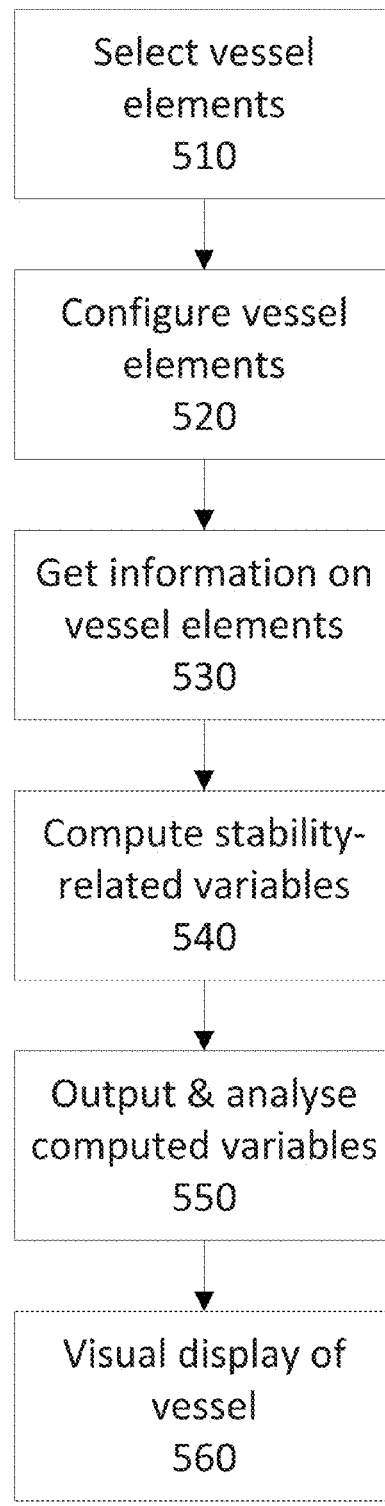
FIG. 5 is a flowchart illustrating the generic steps performed for simulating stability-related variables of a vessel, according to an embodiment.

The input means 200 may comprise:

simulation controls 202 for controlling the course of the simulation by choosing a next step or a previous step (for example the steps described hereinbelow in relation with FIG. 4) or by advancing time (for example, if a bad weather forecast is provided, the user may want to advance in time);

scenario widgets 204 that are used in specific scenarios of the simulation for changing wind intensity or tank levels, selecting a vessel or prompting information about the specific scenario;

simulation panels 206 for configuring a vessel by selecting vessel elements (hull type and size, mast, engine, anchor, fishing gear or any other vessel element contained in the database 150 and mentioned in relation with FIG. 1) and by placing the selected vessel elements on/in the vessel, thus allowing configuring the spatial arrangement of a set of vessel elements chosen by the user, or for choosing an option about the simulation, such as the type of fishing, the vessel's speed; and dialog boxes 208 for asking the user to select a choice or to confirm (for example through an OK button) that he/she took note of an information displayed in the dialog box.

According to an embodiment, the output means 250 may comprise:

a graphical interface 252 for rendering, to allow, for example, a display of the vessel, a display of the vessel in its position (for example its inclination) according the simulated hydrostatic variables, the surface of the ocean, adjacent lands, sky, visual effects (3D, textures), etc.;

simulation information 254 for providing the results of the simulation of hydrostatic variables, including the status of the vessel (whether it has capsized or not), the GZ curve and its area, draft, front draft, aft draft, trim, freeboard, inclination, compliance with stability standards, etc.;

a map window 256 for showing a map of the region in which the vessel is navigating;

a VCG gradient graph 258 for showing the VCG gradient according to a given stability criterion; and user information 260 such as user name or ID, region, trips that are completed and other information or options (e.g. screen mode) for customizing the GUI 120.

It is to be understood that the elements providing some functions can be deleted from an embodiment if the function they provide is not wanted. For example, the simulation panels 206 are not needed if the choices they allow to make are performed through a dialog box instead, or the map window 256 can be taken off if the user does not want a map.

Similarly, outputting user information 260 serves as a convenience for the user and is not useful for simulation purposes.

Similarly, other types of interactive relations between a machine and a user (such as a field to enter text and numbers) may be used to gather input from the user.

Figure 3:
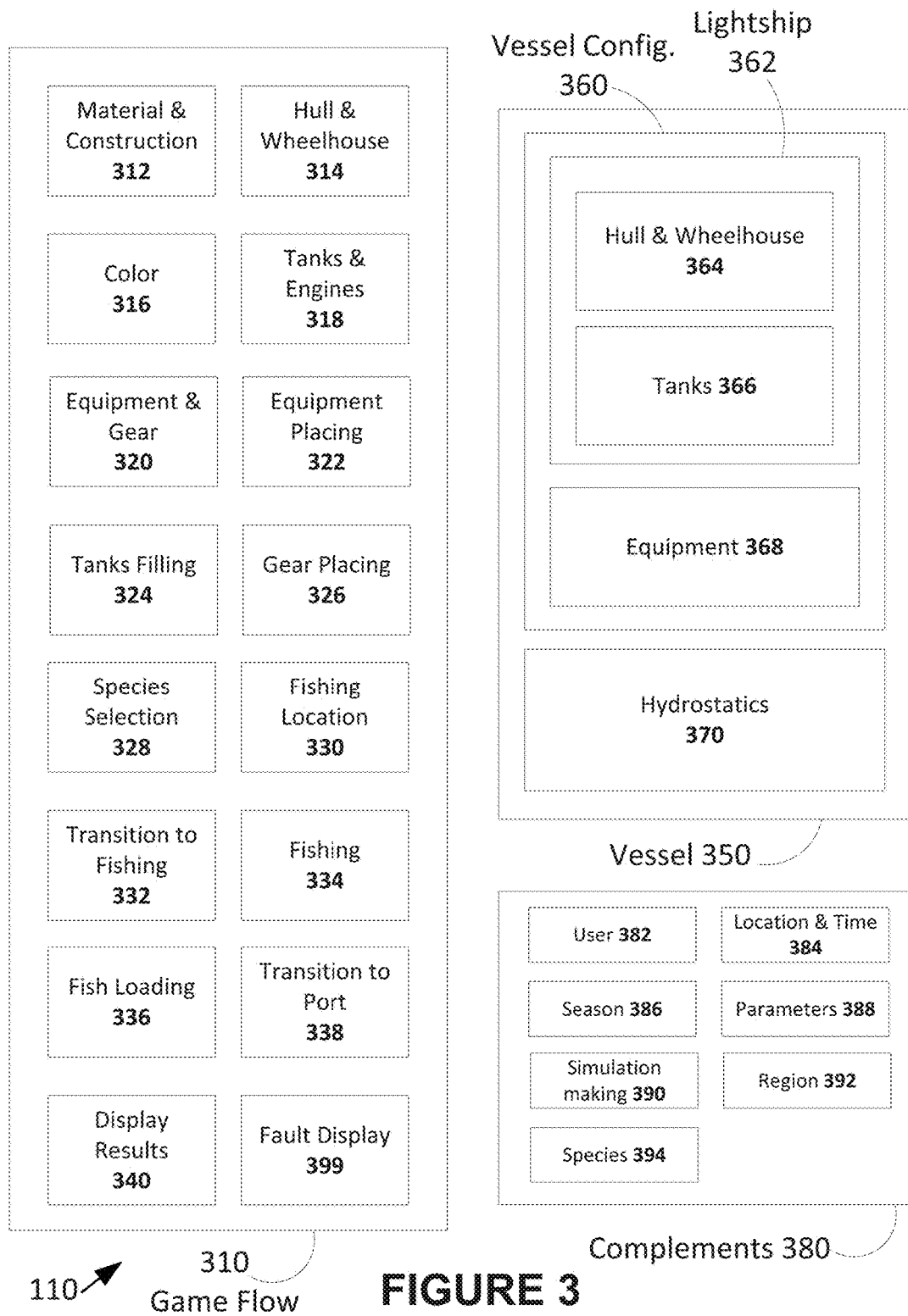
FIG. 3 is a block diagram illustrating the simulation module, according to an embodiment.

Now referring to FIG. 3, there is shown an embodiment of the simulation module 110. According to an embodiment, the simulation module 110 comprises a simulation flow module 310, a vessel module 350, and other modules that can be grouped under the generic term of simulation complementary features 380.

The simulation flow module 310 comprises various sub-modules that allow the simulation to be performed, i.e., to go to a next step or phase. Each sub-module controls the simulation or GUI actions that must be performed for this specific step. Examples of steps are described hereinbelow in relation with FIG. 4. Examples of sub-modules for the steps of FIG. 4 would be: vessel construction and material selection sub-module 312, hull and wheelhouse selection sub-module 314, color selection sub-module 316, tanks and engines placing sub-module 318, equipment and gear selection sub-module 320, permanent equipment placing sub-module 322, tanks filling and crew count selection sub-module 324, fishing gear placing sub-module 326, fish species selection sub-module 328, fishing location selection sub-module 330, transition to fishing sub-module 332, fishing sub-module 334, fish loading sub-module 336, transition to port sub-module 338, trip results display sub-module 340. It is to be understood that some of the sub-modules described above are only relevant for the fishing industry. These sub-modules could be deleted and possibly replaced by other types of sub-modules that would respect the type of step that would be required for simulating a vessel trip in other types of marine activities, or for simulating a static vessel.

The vessel module 350 comprises various sub-modules for configuring the vessel itself and for simulating its behavior, such as the vessel configuration sub-module 360 and the vessel hydrostatics sub-module 370.

The vessel configuration sub-module 360 is responsible for configuring the vessel according to the user input. It uses the user input to create an internal representation of the ship with all the vessel elements configured to respect what the user specified and the rules for configuration mentioned above. The vessel configuration sub-module 360 comprises the lightship sub-module 362, which is made of two sub-modules: the hull and wheelhouse sub-module 364, responsible for configuring and placing elements as specified in the user input, and the tanks sub-module 366, for placing the tanks and configuring how much they are filled with fuel/water/fish. The vessel configuration sub-module 360 further comprises the equipment and crew sub-module 368 for spatially configuring the equipment and the crew on the boat, again respecting the user input and the rules for configuration.

The vessel hydrostatics sub-module 370, contained with the vessel module 350, is responsible for all calculations required by the simulation and that are related to hydrostatics and stability. The vessel hydrostatics sub-module 370 uses the configuration of the vessel determined by the vessel configuration sub-module 360. Using the vessel configuration and the information (weight, density, etc.) about the vessel elements found in the database 150, the vessel hydrostatics sub-module 370 performs calculations to produce results pertaining to the vessel stability.

Examples of calculations that may be performed by the vessel hydrostatics sub-module 370 are the total weight or mass, the displacement (weight of a water volume having the underwater volume of the ship), reserve buoyancy (volume of all watertight spaces above the waterline), draft, front draft, aft draft, trim, position of the centroid, position of the center of gravity G, gradient of the vertical center of gravity (VCG), position of the center of buoyancy B (centroid of the underwater portion), position of the metacenter M, metacentric height GM, position of Z (intersection between a vertical line that goes through B and a horizontal line that goes through G), the length of GZ lever, the GZ curve (also known as righting energy curve or curve of static stability) which is the length of the GZ lever in function of an inclination θ, or the area under the curve, i.e.:

$$\int_{\theta_1}^{\theta_2} GZ(\theta) d\theta$$

The area under the GZ curve between specific values of $\theta_1$ and $\theta_2$ is often used as a stability criteria. For example, in the STAB 4 criteria in Canada, which are based upon the Code on Intact Stability for All Types of Ships Covered by IMO Instruments (IS Code) of the International Maritime Organization, the area under the curve between $\theta_1=30°$ and $\theta_2=40°$, or between $\theta_1=0°$ and $\theta_2=30°$, or between $\theta_1=0°$ and $\theta_2=40°$ (or any other angles which are part of a stability code), can be used as a standard. In this case, the area for all these intervals shall exceed a predetermined value in order to respect the standard. The vessel hydrostatics sub-module 370 is thus configured for verifying if the GZ curve, the area under this curve or the metacentric height respects such standards or criteria and send the results to the GUI 120 for display.

The vessel hydrostatics sub-module 370 is able to take into account a variety of forces that impact the value of the aforementioned variables. For example, using a force and its point of application, the vessel hydrostatics sub-module 370 may compute the moment of force of the wind according to the wind speed, the moment of force of a load (fish in a net, freight on a gantry) being loaded on the vessel, or the moment of force of equipment (permanent equipment, fishing gear, tanks, etc.) placed on the vessel.

The free surface effect may also be computed. Fluids (especially liquids) that fill only in part a container have a tendency to follow an inclination, thereby increasing destabilization of the vessel. Tanks that are partly filled with fuel, water or fish (fish acts like a fluid in this case) are thus taken into account during calculations of the free surface effect and this may have an impact on the position of the center of gravity, on the moment of force that is applied by the fluid in the tank or on other physical considerations.

The effect of waves, which add a horizontal force (and a moment of force) like the wind, may be taken into account.

According to weather conditions in the simulation or a choice of the user, icing of vessel elements may occur. Since the density of ice is known, the effect of icing on the weight can be computed, leading to new values for the center of gravity, center of buoyancy and all other variables mentioned above.

The permanent angle of the vessel, called list, may thus be computed using the permanent vessel elements thereon and their moment of force. The inclination caused by the moment of force of all the external forces may also be computed.

In the end, all the weights, forces, moments of forces, inclinations, etc., are used to output the stability-related information such as the compliance with stability standards (based upon metacentric height GM, GZ lever, its curve and the area the curve) or if the vessel has capsized. Other information of the types that are mentioned above (various drafts, trim, displacement, etc.) may also be outputted.

Stability-related information may be outputted at various times during the simulation, for example each time conditions are changing (important change in wind/wave intensity or direction, conditions before/during/after loading, after a substantial change of fuel quantity in the fuel tank, etc.). Repetitively calculating values of stability-related variables allows creating a score, for example a score for quantifying how much a trip respected stability criteria.

The vessel hydrostatics sub-module 370 may be a complete sub-module developed within the simulation module 110, or it may be an external tool used by the simulation module 110. For example, according to an embodiment, the vessel hydrostatics sub-module 370 uses the Hydrostatics, Stability and Tank Capacities Program (HST) designed by Wolfson Unit for performing at least a part of the required calculations.

For the simulation module 110 to work properly, it may also comprise complementary simulation features module 380, that comprises at least one of:
  a user sub-module 382 for creating and storing information about the user and about its vessel;
  a location/weather/date/time sub-module 384 for creating an imaginary date and time for the simulation, for providing weather and weather forecasts in the simulation and for providing various port locations or fishing locations;
  a season handling sub-module 386 for handling fishing seasons and stability scores;
  a simulation making sub-module 390 for starting a simulation according to a predetermined scenario or not, for loading saved trips or vessel configurations, for saving a trip or a vessel configuration and for quitting the simulation;
  a region selection sub-module 392 for asking to the user or memorizing the region; and
  a region/species sub-module 394 for handling which fish species are available for each region.

A fault detection and display module 399 may be provided in one or various modules or sub-modules to detect faulty configurations or actions.

Although many of the modules have been described in reference with fishing vessels and their activities (dealing with fishing gear, moments of forces applied by fishing gears, fishing trips, fish species for a given region, etc.), these modules/sub-modules/functions could be replaced by equivalent ones which would perform similar functions, but in reference with other types of marine activities, such as leisure boating, passenger or freight transporting and the like. For example, fish loading would be replaced by passenger or freight loading, and fishing locations would be replaced by destination ports, fishing gear would be replaced by gantries or by passenger facilities, etc. The modular computing platform described above may thus be applied to a variety of vessels, ships or boats of various purposes, as long as the properties of their elements are comprised in the database 150.

Similarly, the simulation may apply to a virtual vessel as a part of a software product for educational or scientific purposes, but it may also concern a real vessel for which loading/weighting data are known and which can be simulated in real-time using the present computing platform.

The modular computing platform may advantageously be used in the context of training of ship pilots, leisure boat owners or fish harvesters. These people may thus simulate the behavior of their boat under various conditions (wind, waves, loading, good or bad repartition of equipment on the boat, etc.) at no risk. According to an embodiment, the modular computing platform may be used within an online or software course, providing both lectures and simulations. The modular computing platform may also be used by itself, without any online or software course.

The modular platform may be completely installed on a personal computer, either by downloading it through a network such as the internet or by installation from a memory like a compact disk, therefore allowing complete autonomy to the user, even without any internet connection. In another embodiment, the modular platform comprises a database installed on a remote server computer. In another embodiment, the computing is performed on a remote server computer. Having remote database or computing means allow an easier update of the computing platform.

Method for Using the Computing Platform

The simulation flow module 310 described in relation with the embodiment illustrated in FIG. 3 comprises sub-modules for determining the simulation flow. The simulation flow may comprise a variety of steps which allow the simulation to be performed. FIG. 4 illustrates such steps, again in reference to an exemplary embodiment of a simulation of a fishing vessel, although equivalent steps for passenger vessels, cargo ships or leisure boats can be inferred from this example. These steps may include:
  step 412: vessel construction and material selection;
  step 414: hull and wheelhouse selection;
  step 416: color selection;
  steps 418: tanks and engines placing;
  step 420: equipment and gear selection;
  step 422: permanent equipment placing;
  step 424: tanks filling and crew count selection;
  step 426: fishing gear placing;
  step 428: fish species selection;
  step 430: fishing location selection;
  step 432: transition to fishing;
  step 434: fishing;
  step 436: fish loading;
  step 438: transition to port; and
  step 440: trip results display.

These steps may be performed by the sub-modules 312 to 340, respectively.

According to an embodiment, going from one step to the next one is performed through the GUI 120 (FIG. 1) by the user. Returning back to a preceding step is also possible. Back and forth actions may be performed through buttons on the GUI 120.

The simulation flow is thus performed in combination with the GUI 120 which allows input so that the simulation can be performed, and output so that the results of a step may be presented to the user.

In order to provide the method with simulation capabilities, an additional step needs to be added: stability simulating (step 450). The stability simulating step 450 may be performed using the vessel hydrostatics sub-module 370. This step may therefore give outputs such as values of variables mentioned above as being informative about the stability of the vessel (e.g. area under the GZ curve, the metacentric height GM and the like).

To provide the method with a simulation function, the stability simulating step 450 needs to be performed at least once. According to an embodiment, this step is performed more than once during various phases of the simulation. For example, once the vessel is configured and ready for transition to fishing (step 432), stability simulating may occur. It may however occur during previous steps, for example while gear and equipment are placed on the vessel (e.g. step 422) to have an instant look of how adding/displacing equipment modifies the stability of a boat under static conditions. The stability simulating step 450 may take place until step 440 in which the results are displayed after the vessel has returned to the port.

A more generic method, which does not refer to any context such as fishing, is shown in FIG. 4B:

Step 510: The user selects vessel elements among a list of vessel elements contained in the database and shown at least in part in the GUI 120.

Step 520: The user spatially configures the vessel elements that were selected to place them on/in the vessel. There may be a verification to check if the configuration respects predetermined rules.

Step 530: Information about the vessel elements is extracted from the database.

Step 540: Values of the stability-related variables are computed using the vessel elements placed in the given configuration and the information about the vessel elements.

Step 550: The values of the stability-related variables are outputted on the graphical user interface and may be compared with stability standards or with capsizing thresholds.

Step 560: A visual representation of the vessel may be displayed. The representation is indicative of the values of the stability-related variables, for example by visually representing the boat with the angles and displacements that were computed during the hydrostatic simulation.

Hardware and Operating Environment for Implementing the Computing Platform

Figure 6:
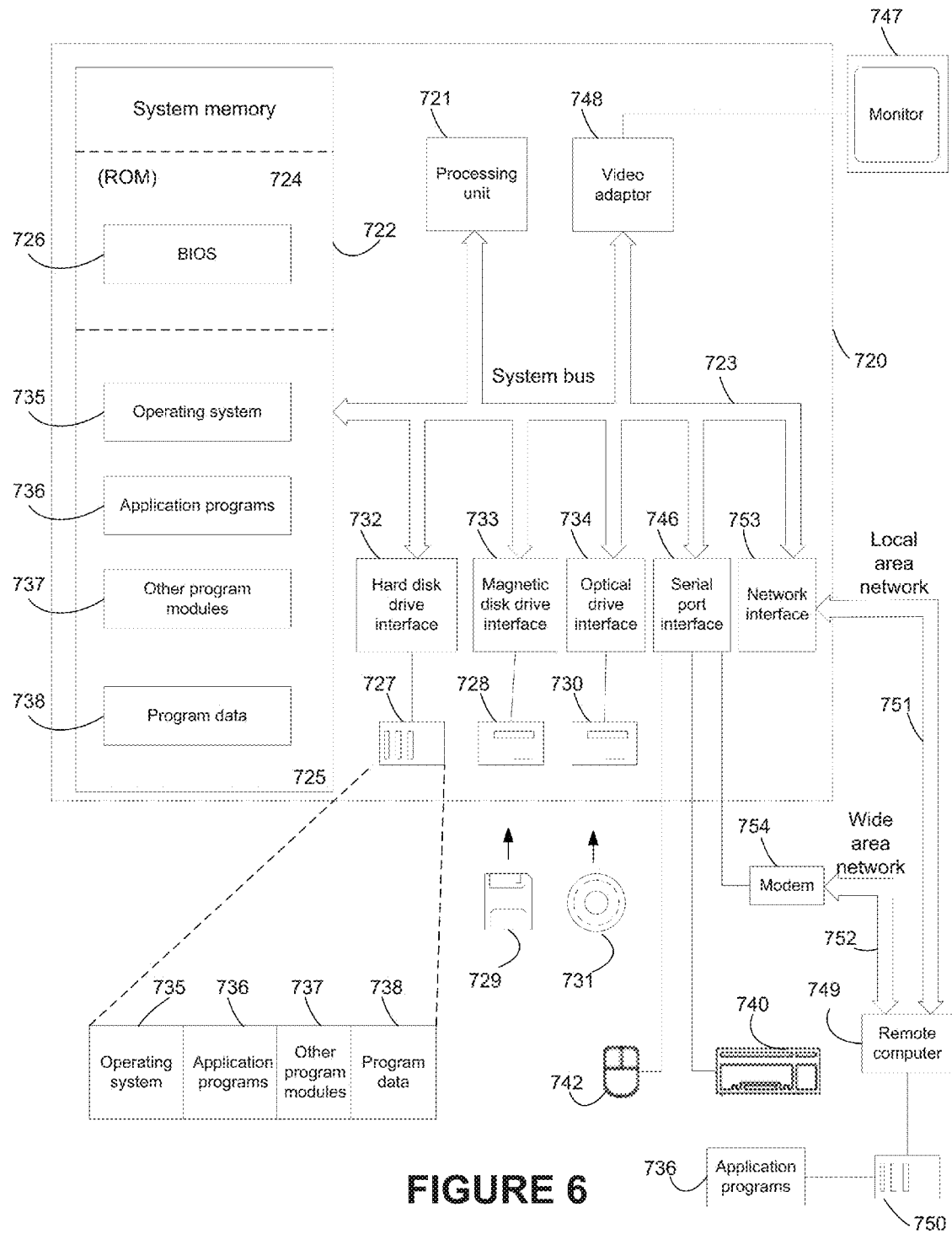
FIG. 6 is a block diagram illustrating a suitable computing environment in which the modular computing platform and the method therefor may be implemented, according to an embodiment.

The computing platform and method therefor described in relation with FIGS. 1 to 5 may be fully appreciated when implemented in a computing operating environment having the necessary processing devices and memory to allow such an implementation. FIG. 6 illustrates an exemplary diagram of a suitable computing operating environment in which embodiments described herein may be practiced. The following description is associated with FIG. 6 and is intended to provide a brief, general description of suitable computer hardware and a suitable computing environment in conjunction with which the embodiments may be implemented. Not all the components are required to practice the embodiments, and variations in the arrangement and type of the components may be made without departing from the spirit or scope of the embodiments.

Although not required, the embodiments are described in the general context of computer-executable instructions, such as program modules, being executed by a computer, such as a personal computer, a hand-held or palm-size computer, Smartphone, or an embedded system such as a computer in a consumer device or specialized industrial controller. Generally, program modules include routines, programs, objects, components, data structures, etc., that perform particular tasks or implement particular abstract data types.

Moreover, those skilled in the art will appreciate that the embodiments may be practiced with other computer system configurations, including hand-held devices, multiprocessor systems, microprocessor-based or programmable consumer electronics, network PCS, minicomputers, mainframe computers, cellular telephones, smart phones, display pagers, radio frequency (RF) devices, infrared (IR) devices, Personal Digital Assistants (PDAs), laptop computers, wearable computers, tablet computers, a device of the IPOD or IPAD family of devices manufactured by Apple Computer, integrated devices combining one or more of the preceding devices, or any other computing device capable of performing the methods and systems described herein. The embodiments may also be practiced in distributed computing environments where tasks are performed by remote processing devices that are linked through a communications network. In a distributed computing environment, program modules may be located in both local and remote memory storage devices.

The exemplary hardware and operating environment of FIG. 6 includes a general purpose computing device in the form of a computer 720, including a processing unit 721, a system memory 722, and a system bus 723 that operatively couples various system components including the system memory to the processing unit 721. There may be only one or there may be more than one processing unit 721, such that the processor of computer 720 comprises a single central-processing unit (CPU), or a plurality of processing units, commonly referred to as a parallel processing environment. The computer 720 may be a conventional computer, a distributed computer, or any other type of computer; the embodiments are not so limited.

The system bus 723 may be any of several types of bus structures including a memory bus or memory controller, a peripheral bus, and a local bus using any of a variety of bus architectures. The system memory may also be referred to as simply the memory, and includes read only memory (ROM) 724 and random access memory (RAM) 725. A basic input/output system (BIOS) 726, containing the basic routines that help to transfer information between elements within the computer 720, such as during start-up, is stored in ROM 724. In one embodiment, the computer 720 further includes a hard disk drive 727 for reading from and writing to a hard disk, not shown, a magnetic disk drive 728 for reading from or writing to a removable magnetic disk 729, and an optical disk drive 730 for reading from or writing to a removable optical disk 731 such as a CD ROM or other optical media. In alternative embodiments, the functionality provided by the hard disk drive 727, magnetic disk 729 and optical disk drive 730 is emulated using volatile or non-volatile RAM in order to conserve power and reduce the size of the system. In these alternative embodiments, the RAM may be fixed in the computer system, or it may be a removable RAM device, such as a Compact Flash memory card.

In an embodiment, the hard disk drive 727, magnetic disk drive 728, and optical disk drive 730 are connected to the system bus 723 by a hard disk drive interface 732, a magnetic disk drive interface 733, and an optical disk drive interface 734, respectively. The drives and their associated computer-readable media provide nonvolatile storage of computer-readable instructions, data structures, program modules and other data for the computer 720. It should be appreciated by those skilled in the art that any type of computer-readable media which can store data that is accessible by a computer, such as magnetic cassettes, flash memory cards, digital video disks, Bernoulli cartridges, random access memories (RAMs), read only memories (ROMs), and the like, may be used in the exemplary operating environment.

A number of program modules may be stored on the hard disk, magnetic disk 729, optical disk 731, ROM 724, or RAM 725, including an operating system 735, one or more application programs 736, other program modules 737, and program data 738. A user may enter commands and information into the personal computer 720 through input devices such as a keyboard 740 and pointing device 742. Other input devices (not shown) may include a microphone, joystick, game pad, satellite dish, scanner, touch sensitive pad, or the like. These and other input devices are often connected to the processing unit 721 through a serial port interface 746 that is coupled to the system bus, but may be connected by other interfaces, such as a parallel port, game port, or a universal serial bus (USB). In addition, input to the system may be provided by a microphone to receive audio input.

A monitor 747 or other type of display device is also connected to the system bus 723 via an interface, such as a video adapter 748. In one embodiment, the monitor comprises a Liquid Crystal Display (LCD). In addition to the monitor, computers typically include other peripheral output devices (not shown), such as speakers and printers. The monitor may include a touch sensitive surface which allows the user to interface with the computer by pressing on or touching the surface.

The computer 720 may operate in a networked environment using logical connections to one or more remote computers, such as a remote computer 749. These logical connections are achieved by a communication device coupled to or a part of the computer 720; the embodiment is not limited to a particular type of communications device. The remote computer 749 may be another computer, a server, a router, a network PC, a client, a peer device or other common network node, and typically includes many or all of the elements described above relative to the computer 720, although only a memory storage device 750 has been illustrated in FIG. 6. The logical connections depicted in FIG. 6 include a local-area network (LAN) 751 and a wide-area network (WAN) 752. Such networking environments are commonplace in offices, enterprise-wide computer networks, intranets and the Internet.

When used in a LAN-networking environment, the computer 720 is connected to the local network 751 through a network interface or adapter 753, which is one type of communications device. When used in a WAN-networking environment, the computer 720 typically includes a modem 754, a type of communications device, or any other type of communications device for establishing communications over the wide area network 752, such as the Internet. The modem 754, which may be internal or external, is connected to the system bus 723 via the serial port interface 746. In a networked environment, program modules depicted relative to the personal computer 720, or portions thereof, may be stored in the remote memory storage device. It is appreciated that the network connections shown are exemplary and other means of and communications devices for establishing a communications link between the computers may be used.

The hardware and operating environment in conjunction with which embodiments may be practiced has been described. The computer in conjunction with which embodiments may be practiced may be a conventional computer a hand-held or palm-size computer, a computer in an embedded system, a distributed computer, or any other type of computer; the embodiments are not so limited. Such a computer typically includes one or more processing units as its processor, and a computer-readable medium such as a memory. The computer may also include a communications device such as a network adapter or a modem, so that it is able to communicatively couple other computers.

Figure 7:
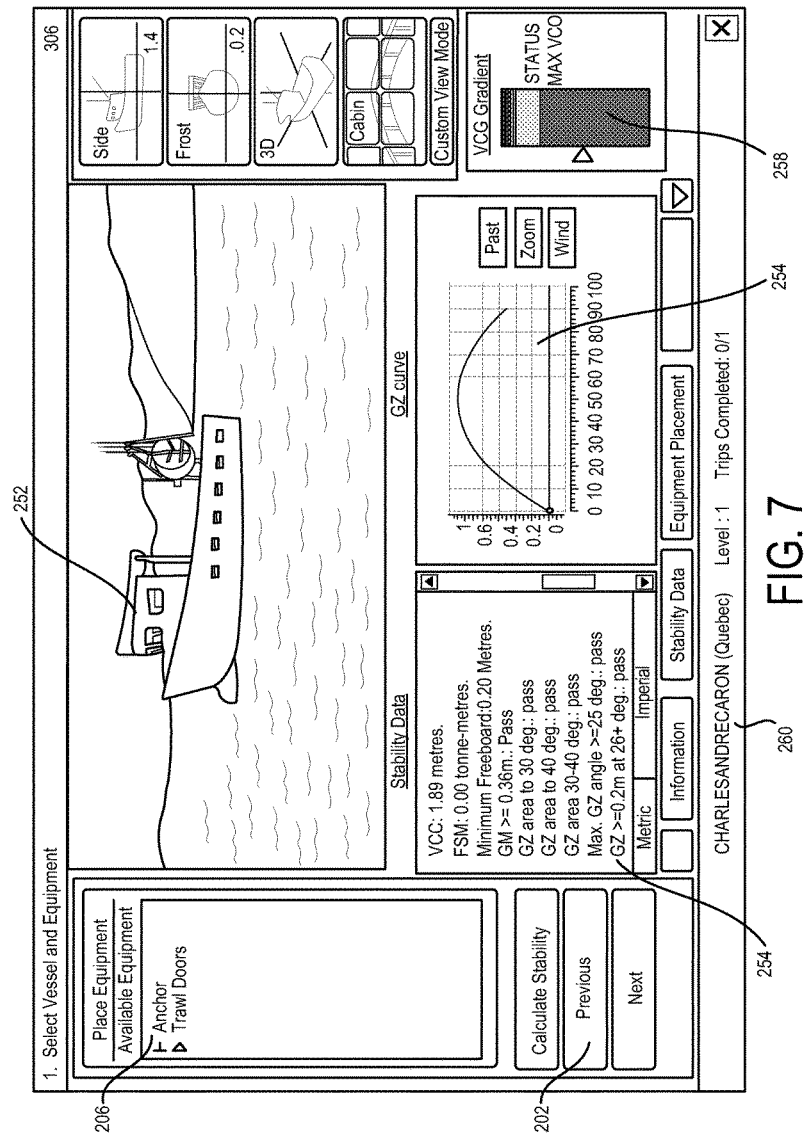
FIG. 7 is a screenshot of a graphical user interface, according to an embodiment.

The GUI 120 is configured to be displayed on the monitor 747. An exemplary display of the GUI 120, as could appear on the monitor 747, is illustrated in FIG. 7. A simulation panel 206 is provided on the left part of FIG. 7, wherein the equipment chosen in a previous step is shown. The simulation controls 202 show buttons to transit to a previous or next phase of the simulation are apparent. There is also provided a button to trigger the calculation of the values of the stability-related variables. The values of the stability-related variables are visible as simulation information 154. A graph of the GZ curve is also provided. Furthermore, a VCG gradient graph 258 is displayed. User information 260 is also displayed in the lower part of the screen.

A part of the screen is occupied by a graphical interface 252 which represents the vessel in a state that is representative of the values of the stability-related variables. For example, if a significant trim is computed in the simulation, the illustrated vessel should also display a significant trim. The same applies for other types of angles or displacements. The graphical interface 252 comprises a right panel where buttons are available to change the view of the vessel (inside view, side view, front/back view, view from a user-defined orientation).

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A computing platform for simulating stability-related variables of a vessel comprising vessel elements placed in a given configuration, the computing platform comprising:
   a database for storing:
      a list of the vessel elements; and
      information about the vessel elements;
   a simulation module for computing values of the stability-related variables using the vessel elements placed in the given configuration and the information about the vessel elements; and
   a graphical user interface for:
      receiving user instructions about a selection of the vessel elements among the list of the vessel elements and about the configuration of the vessel elements on the vessel;
      outputting the values of the stability-related variables; and
      displaying a representation of the vessel indicative of the values of the stability-related variables.

2. The computing platform of claim 1, wherein the simulation module for computing the values of the stability-related variables is further for computing the value of at least one of a metacentric height and a GZ curve using the vessel elements placed in the given configuration and the information about the vessel elements.

3. The computing platform of claim 2, wherein the simulation module is further for determining if the value of at least one of the metacentric height and an area under the GZ curve meets given stability criteria.

4. The computing platform of claim 1, wherein the database for storing the list of the vessel elements comprises a database for storing a list of vessel elements comprising: a hull, an engine, a tank, and a piece of equipment for loading.

5. The computing platform of claim 1, wherein the database for storing information about the vessel elements comprises a database for storing at least one of a weight, a density and size data about the vessel elements.

6. The computing platform of claim 1, wherein the database further comprises rules about the configuration of the vessel elements on the vessel, and wherein the simulation module is further for determining if the user instructions about the configuration of the vessel elements on the vessel respect the rules.

7. The computing platform of claim 1, wherein the simulation module is further for transiting from a current phase to at least one of a next phase and a previous phase, at least one of the current phase, the next phase and the previous phase being characterized by allowed actions, the allowed actions comprising at least one of selecting the vessel elements among the list of the vessel elements, spatially configuring the vessel elements on the vessel, performing loading tasks with the vessel and displaying the values of the stability-related variables.

8. A method for simulating stability-related variables of a vessel comprising vessel elements placed in a given configuration, the method comprising:
   receiving, through a graphical user interface, user instructions about a selection of the vessel elements among a list of vessel elements and about the configuration of the vessel elements on the vessel;
   receiving information about the vessel elements;
   computing values of the stability-related variables using the vessel elements placed in the given configuration and the information about the vessel elements;
   outputting the values of the stability-related variables on the graphical user interface;
   displaying a representation of the vessel indicative of the values of the stability-related variables on the graphical user interface.

9. The method of claim 8, wherein computing the values of the stability-related variables comprises computing the value of at least one of a metacentric height and a GZ curve using the vessel elements placed in the given configuration and the information about the vessel elements.

10. The method of claim 9, further comprising determining if the value of at least one of the metacentric height and an area under the GZ curve meets given stability criteria.

11. The method of claim 8, wherein receiving user instructions about a selection of the vessel elements among a list of vessel elements comprises receiving a selection of the vessel elements among a list comprising: a hull, an engine, a tank, and a piece of equipment for loading.

12. The method of claim 8, wherein receiving information about the vessel elements comprises receiving at least one of a weight, a density and size data about the vessel elements.

13. The method of claim 8, wherein receiving user instructions about the configuration of the vessel elements on the vessel comprises determining if the configuration respects configuration rules.

14. The method of claim 8, further comprising transiting from a current phase to at least one of a next phase and a previous phase, at least one of the current phase, the next phase and the previous phase being characterized by allowed actions, the allowed actions comprising at least one of selecting the vessel elements among the list of the vessel elements, spatially configuring the vessel elements on the vessel, performing loading tasks with the vessel and displaying the values of the stability-related variables.

15. A computing device for simulating stability-related variables of a vessel comprising vessel elements placed in a given configuration, the computing device comprising:
   a processing device;
   a memory for storing a list of the vessel elements and information about the vessel elements;
   a memory for storing instructions which cause the processing device:
      to get user instructions about a selection of the vessel elements among the list of the vessel elements and about the configuration of the vessel elements on the vessel;
      to compute values of the stability-related variables using the vessel elements placed in the given configuration and the information about the vessel elements; and
      to output the values of the stability-related variables; and
   a visual display for displaying a representation of the vessel indicative of the values of the stability-related variables,
wherein the processing device, the memories and the visual display are in communication together.

16. The computing device of claim 15, wherein the instructions comprise instructions which cause the processing device to compute the value of at least one of a metacentric height and a GZ curve using the vessel elements placed in the given configuration and the information about the vessel elements.

17. The computing device of claim 16, the instructions further comprising instructions which cause the processing device to determine if the value of at least one of the metacentric height and an area under the GZ curve meets given stability criteria.

18. The computing device of claim 15, wherein the memory for storing a list of the vessel elements comprises a memory for storing a list comprising: a hull, an engine, a tank, and a piece of equipment for loading.

19. The computing device of claim 15, wherein the memory for storing information about the vessel elements comprises a memory for storing at least one of a weight, a density and size data about the vessel elements.

20. The computing device of claim 15, wherein the instructions comprise instructions which cause the processing device to determine if the configuration respects configuration rules.

21. The computing device of claim 15, the instructions further comprising instructions which cause the processing device to transit from a current phase to at least one of a next phase and a previous phase, at least one of the current phase, the next phase and the previous phase being characterized by allowed actions, the allowed actions comprising at least one of selecting the vessel elements among the list of the vessel elements, spatially configuring the vessel elements on the vessel, performing loading tasks with the vessel and displaying the values of the stability-related variables.

* * * * *